US008953833B2

(12) United States Patent
Cohen et al.

(10) Patent No.: US 8,953,833 B2
(45) Date of Patent: Feb. 10, 2015

(54) SYSTEMS AND METHODS FOR CONTROLLING AIRFLOW INTO AN ELECTRONIC DEVICE

(75) Inventors: Sawyer Cohen, Cupertino, CA (US); Scott Porter, Cupertino, CA (US); Ruchir Dave, San Jose, CA (US)

(73) Assignee: Apple Inc., Cupertino, CA (US)

( * ) Notice: Subject to any disclaimer, the term of this patent is extended or adjusted under 35 U.S.C. 154(b) by 127 days.

(21) Appl. No.: 13/607,512

(22) Filed: Sep. 7, 2012

(65) Prior Publication Data
US 2014/0072164 A1 Mar. 13, 2014

(51) Int. Cl.
*H04R 1/02* (2006.01)
(52) U.S. Cl.
USPC ......................................... 381/395

(58) Field of Classification Search
USPC ......................................... 381/395, 175, 382
See application file for complete search history.

(56) References Cited

U.S. PATENT DOCUMENTS

| 8,526,651 B2 * | 9/2013 | Lafort et al. ................. 381/328 |
| 2012/0082335 A1 * | 4/2012 | Duisters et al. ............... 381/375 |

* cited by examiner

*Primary Examiner* — Davetta W Goins
*Assistant Examiner* — Amir Etesam
(74) *Attorney, Agent, or Firm* — Brownstein Hyatt Farber Schreck, LLP

(57) ABSTRACT

Systems and methods for controlling airflow into an electronic device are disclosed. An airflow control system may include an airflow impedance plate having one or more airflow impeding features. The airflow impedance plate may be a passive device that may be configured to impede forceful airflow therethrough and also allow sound to pass therethrough.

22 Claims, 11 Drawing Sheets

SYSTEMS AND METHODS FOR CONTROLLING AIRFLOW INTO AN ELECTRONIC DEVICE

FIELD OF THE INVENTION

This can relate to systems and methods for controlling airflow, and more particularly, to systems and methods for controlling airflow into an electronic device.

BACKGROUND OF THE DISCLOSURE

Many electronic devices include microelectromechanical system (MEMS) components. Sometimes referred to as a micromachine, a MEMS component, such as a MEMS microphone, is smaller than a conventional counterpart, and may thus allow an electronic device to be made smaller. A MEMS microphone may be situated within a housing of an electronic device, such as adjacent to a surface of the housing. One problem with existing MEMS microphones is that, if a MEMS microphone is subjected to forceful airflow (e.g., from a deliberate forceful blasting of compressed air thereon, or from severe environmental conditions, such as extreme winds), air particles of the forceful airflow may be directed up one or more apertures and towards the MEMS microphone. When this occurs, the performance of the microphone may become affected.

SUMMARY OF THE DISCLOSURE

Systems and methods for controlling airflow into an electronic device are provided.

In some embodiments, an airflow control system for controlling airflow to a microphone may be provided. The airflow control system may include a top plate having a top plate aperture, and an airflow impedance plate disposed below the top plate. The airflow impedance plate may include a flat surface and a bendable flap that may be partially separated from the flat surface. The bendable flap may include a top face and a bottom face. The bendable flap may be operative to bend with respect to the flat surface and at least partially cover the top plate aperture with the top face when a force exerted by the airflow onto the bottom face exceeds a predetermined amount.

In some embodiments, a method of manufacturing an airflow control system may be provided. The method may include processing a first adhesive member and a second adhesive member to form respective holes. The method may also include coupling the first adhesive member to a top surface of an airflow impedance plate and the second adhesive member to a bottom surface of the airflow impedance plate. The method may also include altering the airflow impedance plate to form a bendable flap on the airflow impedance plate based on each of the formed holes. The method may also include trimming edge portions of each of the airflow impedance plate and the first and second adhesive members to provide the airflow control system.

In some embodiments, an electronic device may be provided. The electronic device may include a housing that may include a housing aperture. The electronic device may also include a microphone having a microphone aperture. The electronic device may also include an airflow control system that may be secured between the housing aperture and the microphone aperture. The airflow control system may fluidically couple the housing aperture to the microphone aperture and may be operative to enhance a performance of the microphone.

In some embodiments, an airflow control system for controlling airflow to a microphone may be provided. The airflow control system may include a block-shaped structure that may include a recess and a first aperture. The airflow control system may also include an airflow impedance sheet disposed on the recess. The airflow impedance sheet may include a surface having a top face and a bottom face. At least a portion of the surface being operative to bend and at least partially cover the first aperture with the top face when a force exerted by the airflow onto the bottom face exceeds a predetermined amount.

BRIEF DESCRIPTION OF THE DRAWINGS

The above and other aspects and advantages of the invention will become more apparent upon consideration of the following detailed description, taken in conjunction with accompanying drawings, in which like reference characters refer to like parts throughout, and in which.

DETAILED DESCRIPTION OF THE DISCLOSURE

Systems and methods for controlling airflow into an electronic device are provided and described with reference to FIGS. 1-14.

Figure 1A:
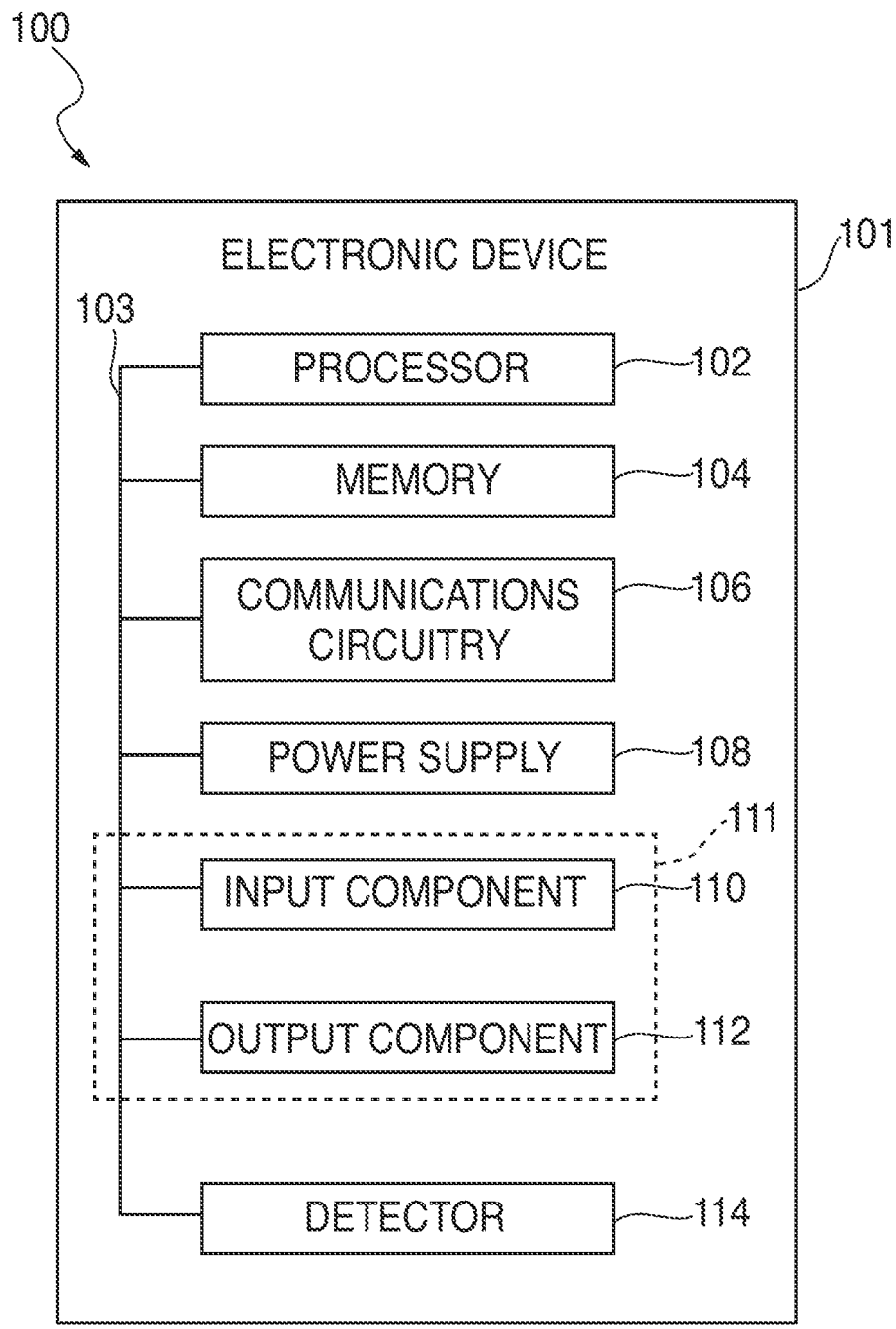
FIG. 1A is a schematic view of an illustrative electronic device, in accordance with at least one embodiment.

FIG. 1A is a schematic view of an illustrative electronic device 100. In some embodiments, electronic device 100 may perform a single function (e.g., a device dedicated to storing image content) and, in other embodiments, electronic device 100 may perform multiple functions (e.g., a device that stores image content, plays music, and receives and transmits telephone calls). Moreover, in some embodiments, electronic device 100 may be any portable, mobile, or hand-held electronic device configured to control output of content. Alternatively, electronic device 100 may not be portable at all, but may instead be generally stationary. Electronic device 100 may include any suitable type of electronic device operative to control output of content. For example, electronic device 100 may include a media player (e.g., an iPod™ available by Apple Inc. of Cupertino, Calif.), a cellular telephone (e.g., an iPhone™ available by Apple Inc.), a personal e-mail or messaging device (e.g., a Blackberry™ available by Research In Motion Limited of Waterloo, Ontario), any other wireless communication device, a pocket-sized personal computer, a personal digital assistant ("PDA"), a tablet, a laptop computer, a desktop computer, a music recorder, a still camera, a movie or video camera or recorder, a radio, medical equipment, any other suitable type of electronic device, and any combinations thereof.

Electronic device 100 may include a processor or control circuitry 102, memory 104, communications circuitry 106, power supply 108, input component 110, output component 112, and a detector 114. Electronic device 100 may also include a bus 103 that may provide a transfer path for transferring data and/or power, to, from, or between various other components of device 100. In some embodiments, one or more components of electronic device 100 may be combined or omitted. Moreover, electronic device 100 may include other components not combined or included in FIG. 1A. For example, electronic device 100 may include motion detection circuitry, light sensing circuitry, positioning circuitry, or several instances of the components shown in FIG. 1A. For the sake of simplicity, only one of each of the components is shown in FIG. 1A.

Memory 104 may include one or more storage mediums, including for example, a hard-drive, flash memory, permanent memory such as read-only memory ("ROM"), semi-permanent memory such as random access memory ("RAM"), any other suitable type of storage component, or any combination thereof. Memory 104 may include cache memory, which may be one or more different types of memory used for temporarily storing data for electronic device applications. Memory 104 may store media data (e.g., music, image, and video files), software (e.g., for implementing functions on device 100), firmware, preference information (e.g., media playback preferences), lifestyle information (e.g., food preferences), exercise information (e.g., information obtained by exercise monitoring equipment), transaction information (e.g., information such as credit card information), wireless connection information (e.g., information that may enable device 100 to establish a wireless connection), subscription information (e.g., information that keeps track of podcasts or television shows or other media a user subscribes to), contact information (e.g., telephone numbers and e-mail addresses), calendar information, any other suitable data, or any combination thereof.

Communications circuitry 106 may be provided to allow device 100 to communicate with one or more other electronic devices or servers using any suitable communications protocol. For example, communications circuitry 106 may support Wi-Fi (e.g., an 802.11 protocol), Ethernet, Bluetooth™, high frequency systems (e.g., 900 MHz, 2.4 GHz, and 5.6 GHz communication systems), infrared, transmission control protocol/internet protocol ("TCP/IP") (e.g., any of the protocols used in each of the TCP/IP layers), hypertext transfer protocol ("HTTP"), BitTorrent™, file transfer protocol ("FTP"), real-time transport protocol ("RTP"), real-time streaming protocol ("RTSP"), secure shell protocol ("SSH"), any other communications protocol, or any combination thereof. Communications circuitry 106 may also include circuitry that can enable device 100 to be electrically coupled to another device (e.g., a computer or an accessory device) and communicate with that other device, either wirelessly or via a wired connection.

Power supply 108 may provide power to one or more of the other components of device 100. In some embodiments, power supply 108 can be coupled to a power grid (e.g., when device 100 is not a portable device, such as a desktop computer). In some embodiments, power supply 108 can include one or more batteries for providing power (e.g., when device 100 is a portable device, such as a cellular telephone). As another example, power supply 108 can be configured to generate power from a natural source (e.g., solar power using solar cells).

One or more input components 110 may be provided to permit a user to interact or interface with device 100. For example, input component 110 can take a variety of forms, including, but not limited to, an electronic device pad, dial, click wheel, scroll wheel, touch screen, one or more buttons (e.g., a keyboard), mouse, joy stick, track ball, a microphone, and combinations thereof. For example, input component 110 may include a multi-touch screen. Each input component 110 can be configured to provide one or more dedicated control functions for making selections or issuing commands associated with operating device 100.

Electronic device 100 may also include one or more output components 112 that may present information (e.g., textual, graphical, audible, and/or tactile information) to a user of device 100. Output component 112 of electronic device 100 may take various forms, including, but not limited, to audio speakers, in-ear earphones, headphones, audio line-outs, visual displays, antennas, infrared ports, rumblers, vibrators, or combinations thereof.

For example, output component 112 of electronic device 100 may include an image display 112 as an output component. Such an output component display 112 may include any suitable type of display or interface for viewing image data captured by detector 114. In some embodiments, display 112 may include a display embedded in device 100 or coupled to device 100 (e.g., a removable display). Display 112 may include, for example, a liquid crystal display ("LCD"), a light emitting diode ("LED") display, an organic light-emitting diode ("OLED") display, a surface-conduction electron-emitter display ("SED"), a carbon nanotube display, a nanocrystal display, any other suitable type of display, or combination thereof. Alternatively, display 112 can include a movable display or a projecting system for providing a display of content on a surface remote from electronic device 100, such as, for example, a video projector, a head-up display, or a three-dimensional (e.g., holographic) display.

In some embodiments, output component 112 may include an audio output module that may be coupled to an audio connector (e.g., a male audio jack) for interfacing with an audio device (e.g., a headphone, an in-ear earphone, a microphone, etc.).

It should be noted that one or more input components 110 and one or more output components 112 may sometimes be referred to collectively herein as an I/O interface (e.g., input component 110 and output component 112 as I/O interface 111). It should also be noted that input component 110 and output component 112 may sometimes be a single I/O component, such as a touch screen that may receive input information through a user's touch of a display screen and that may also provide visual information to a user via that same display screen.

Detector 114 may include one or more sensors of any suitable type that may capture human recognition data (e.g., face data) that may be utilized to detect the presence of one or more individuals. For example, detector 114 may include an image sensor and/or an infrared sensor. The image sensor may include one or more cameras with any suitable lens or number of lenses that may be operative to capture images of the surrounding environment of electronic device 100. For example, the image sensor may include any number of optical or digital lenses for capturing light reflected by the device's environment as an image. The captured light may be stored as an individual distinct image or as consecutive video frame images of a recording (e.g., several video frames including a primary frame and one or more subsequent frames that may indicate the difference between the primary frame and the subsequent frame). As used herein, the term "camera lens" may be understood to mean a lens for capturing light or a lens and appropriate circuitry for capturing and converting captured light into an image that can be analyzed or stored by electronic device 100 as either an individual distinct image or as one of many consecutive video frame images.

In some embodiments, detector 114 may also include one or more sensors that may detect any human feature or characteristic (e.g., physiological, psychological, physical, movement, etc.). For example, detector 114 may include a microphone for detecting voice signals from one or more individuals. As another example, detector 114 may include a heartbeat sensor for detecting heartbeats of one or more individuals. As yet other examples, detector 114 may include a fingerprint reader, an iris scanner, a retina scanner, a breath sampler, and a humidity sensor that may detect moisture and/or sweat emanating from any suitable portion of an individual's body. For example, detector 114 may include a humidity sensor that may be situated near or coupled to one or more portions of input component 110, and that may detect moisture and/or sweat from an individual's hands. It should be appreciated that any detector 114 may include any sensor that may detect any human feature or characteristic.

In some embodiments, detector 114 may also include positioning circuitry for determining a current position of device 100. The positioning circuitry may be operative to update the current position at any suitable rate, including at relatively high rates to provide an estimation of speed and distance traveled. In some embodiments, the positioning circuitry may include a global positioning system ("GPS") receiver for accessing a GPS application function call that may return geographic coordinates (i.e., a geographic location) of the device. The geographic coordinates may be fundamentally, alternatively, or additionally, derived from any suitable trilateration or triangulation technique. For example, the positioning circuitry may determine the current location of device 100 by using various measurements (e.g., signal-to-noise ratio ("SNR") or signal strength) of a network signal (e.g., a cellular telephone network signal) that may be associated with device 100. For example, a radio frequency ("RF") triangulation detector or sensor integrated with or connected to device 100 may determine the (e.g., approximate) current location of device 100. Device 100's current location may be determined based on various measurements of device 100's own network signal, such as, for example: (1) an angle of the signal's approach to or from one or more cellular towers, (2) an amount of time for the signal to reach one or more cellular towers or device 100, (3) the strength of the signal when it reaches one or more towers or device 100, or any combination of the aforementioned measurements. Other forms of wireless-assisted GPS (e.g., enhanced GPS or A-GPS) may also be used to determine the current position of device 100. Instead or in addition, the positioning circuitry may determine the current location of device 100 based on a wireless network or access point that may be in range or a wireless network or access point to which device 100 may be currently connected. For example, because wireless networks may have a finite range, a wireless network that may be in range of device 100 may indicate that device 100 is located in within a detectable vicinity of the wireless network. In some embodiments, device 100 may automatically connect to a wireless network that may be in range in order to receive valid modes of operation that may be associated or that may be available at the current position of device 100.

In some embodiments, detector 114 may also include motion sensing circuitry for detecting motion of an environment of device 100 and/or objects in the environment. For example, the motion sensing circuitry may detect a movement of an object (e.g., an individual) about device 100 and may generate one or more signals based on the detection.

Processor 102 of device 100 may control the operation of many functions and other circuitry provided by device 100. For example, processor 102 may receive input signals from input component 110 and/or drive output signals through display 112. Processor 102 may load a manager program (e.g., a program stored in memory 104 or another device or server accessible by device 100) to process or analyze data received via detector 114 or inputs received via input component 110 to control output of content that may be provided to the user via output component 112 (e.g., display 112). Processor 102 may associate different metadata with the human recognition data captured by detector 114, including, for example, positioning information, device movement information, a time code, a device identifier, or any other suitable metadata. Electronic device 100 (e.g., processor 102, any circuitry of detector 114, or any other component available to device 100) may be configured to capture data with detector 114 at various resolutions, frequencies, intensities, and various other characteristics as may be appropriate for the capabilities and resources of device 100.

Electronic device 100 may also be provided with a housing 101 that may at least partially enclose one or more of the components of device 100 for protecting them from debris and other degrading forces external to device 100. In some embodiments, one or more of the components may be provided within its own housing (e.g., input component 110 may be an independent keyboard or mouse within its own housing that may wirelessly or through a wire communicate with processor 102, which may be provided within its own housing).

Electronic device 100 may include one or more microphones (e.g., as part of I/O interface 111) for capturing sounds from the environment (e.g., a user's voice). It should be appreciated that various criteria may be used to select the type of microphone for inclusion in an electronic device. For example, it may be preferable to use microphones that draw minimal power, that are compact, and that are easy to manufacture and integrate into electronic devices. As another example, it may be important to choose a microphone that provides a suitable frequency response. For example, a microphone may have a suitable frequency response if it can receive sounds over a range of frequencies that are audible to humans. MEMS microphones can provide one or more of these features. For example, MEMS microphones are smaller than conventional counterparts, and may allow an electronic device to be made smaller. MEMS microphones are also easy to integrate into electronic devices and can provide suitable frequency responses.

Figure 1B:
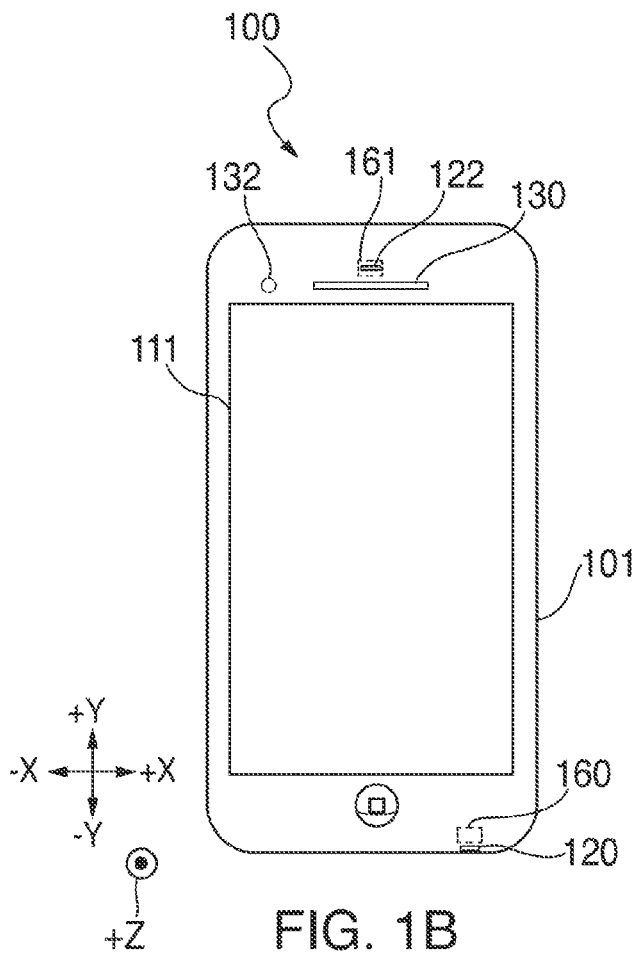
FIG. 1B is a front view of the electronic device of FIG. 1A, in accordance with at least one embodiment.

FIG. 1B is a front view of electronic device 100. As shown in FIG. 1B, housing 101 may at least partially enclose I/O interface 111. Moreover, housing 101 may include a microphone 160 (e.g., a MEMS microphone) and an aperture 120 through a portion of housing 101 (e.g., cut through a glass portion of housing 101). Aperture 120 may be situated on a bottom surface of electronic device 100 and may face the −Y direction. Microphone 160 may be situated within housing 101 and adjacent aperture 120 such that, when a user holds electronic device 100 close to the user's face, sound from the user's mouth may pass through aperture 120 and travel towards microphone 160.

Although typical electronic devices may only include a single microphone, electronic device 100 may include a plurality of microphones. For example, electronic device 100 may include an aperture 122 through another portion of housing 101 (e.g., cut through another glass portion of housing 101) and may, in addition to microphone 160, include a microphone 161 (e.g., another MEMS microphone). Aperture 122 may be situated on a front surface of housing 101 (e.g., adjacent a receiver 130 that may be a component of detector 114) and may face the +Z direction (e.g., out of the page shown in FIG. 1B). Microphone 161 may be situated within housing 101 and adjacent aperture 122 such that, when a user holds electronic device 100 with the front surface facing the user (e.g., during a video conference using a camera 132 of electronic device 100), sound from the user's mouth may pass through aperture 122 and travel towards microphone 161. Situating microphone 161 on the front surface of housing 101 may more efficiently capture sound during such a video conference call, since the sound from the user's mouth may not be sufficiently directed towards the bottom surface of housing 101 for microphone 160 to capture.

Figure 1C:
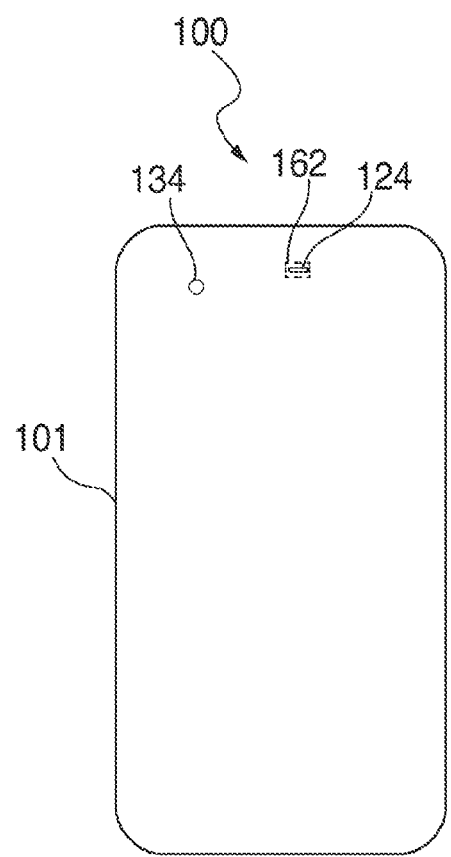
FIG. 1C is a back view of the electronic device of FIG. 1A, in accordance with at least one embodiment.

FIG. 1C is a back view of electronic device 100. As shown in FIG. 1C, electronic device 100 may include an aperture 124 through another portion of housing 101 (e.g., cut through yet another glass portion of housing 101) and may, in addition to microphones 160 and 161, include a microphone 162 (e.g., yet another MEMS microphone). Aperture 124 may be situated on a back surface of housing 101 (e.g., near a top portion of the back surface) and may face a direction opposite the +Z direction of FIG. 1B. Microphone 162 may be situated within housing 101 and adjacent aperture 124 such that, when a user holds electronic device 100 with the back surface facing the user (e.g., during a video conference using a camera 134 of electronic device 100), sound from the user's mouth may pass through aperture 124 and travel towards microphone 162. Situating microphone 162 on the back surface of housing 101 may allow more efficient capture of sound during such a video conference call, since the sound from the user's mouth may not be sufficiently directed towards the front or bottom surfaces of housing 101 for any of microphones 160 and 161 to capture.

One problem with existing MEMS microphones is that, if a MEMS microphone is subjected to forceful airflow (e.g., from a deliberate forceful blasting of compressed air thereon, or from severe environmental conditions, such as extreme winds), air particles of the forceful airflow may be directed up one or more apertures of an electronic device as a pressure wave towards the microphone. For example, when forceful airflow is directed into an aperture (e.g., any one of apertures 120, 122, and 124) of electronic device 100, air particles of the forceful airflow may be directed at a corresponding microphone (e.g., a corresponding one of microphones 160, 161, and 162). If the force of the airflow exceeds a predetermined amount, the performance of the microphone may decrease, or in some cases, the microphone can be damaged.

Figure 2A:
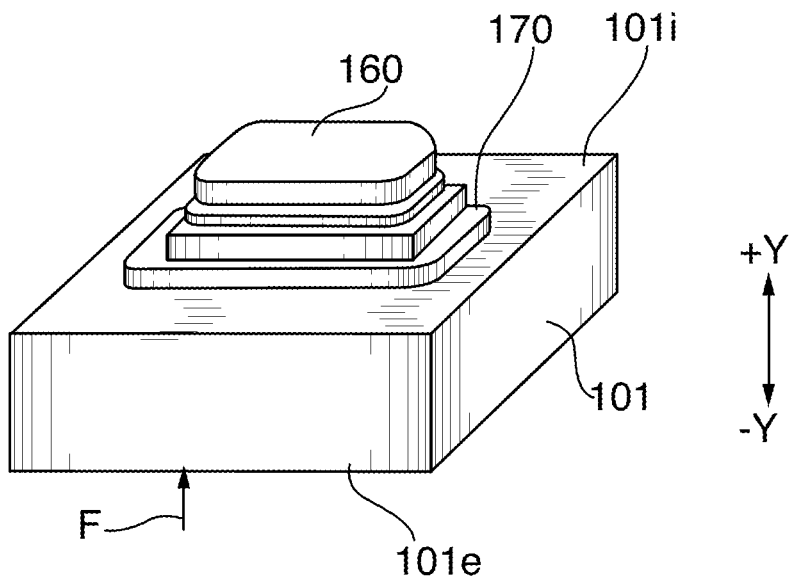
FIG. 2A is a perspective view of a portion of the electronic device of FIG. 1A, in accordance with at least one embodiment.
Figure 2B:
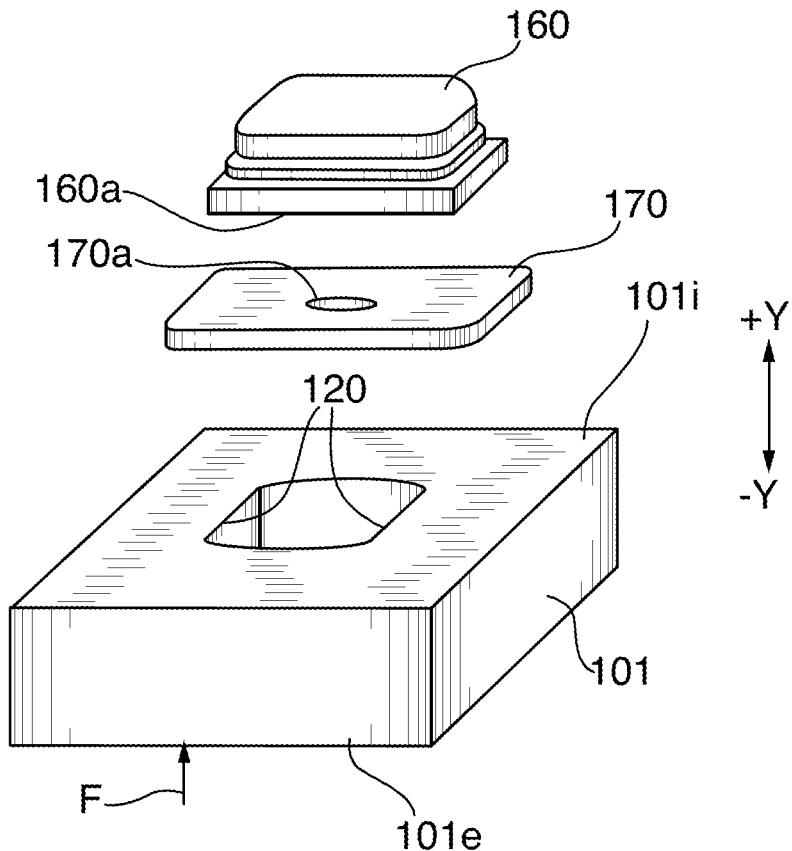
FIG. 2B is an exploded view of the portion of the electronic device of FIG. 2A, in accordance with at least one embodiment.

FIG. 2A is a perspective view of a portion of electronic device 100. FIG. 2B is an exploded view of this portion of electronic device 100. The portion may include a portion of housing 101 having aperture 120, which may face the −Y direction. Housing 101 may include external surface side 101*e* and internal surface side 101*i*, and aperture 120 may extend from external surface side 101*e* to internal surface side 101*i*. Electronic device 100 may include a circuit board 170 (e.g., a flexible circuit board) adjacent internal surface side 101*i*. Circuit board 170 may include circuit board aperture 170*a*. Electronic device 100 may also include a microphone 160 that may be attached to circuit board 170. As described above, microphone 160 may be a MEMS microphone that may include microphone aperture 160*a* for receiving sound (e.g., from a user's voice). Housing 101, circuit board 170, and microphone 160 may align with respect to each other in any suitable manner. For example, FIGS. 2A and 2B show these components aligning with one another such that sound, that may enter housing 101 through aperture 120 in the +Y direction, may travel through housing aperture 120, circuit board aperture 170*a*, and microphone aperture 160*a* into microphone 160, in this order.

Microphone 160 may include a diaphragm (not shown) that may receive the sound, and may process the received sound and/or send the received sound to processor 102 for processing. The performance of one or more components of microphone 160 (e.g., the diaphragm) may be affected, for example, when airflow is forcefully directed at microphone 160, at or above a predefined force F. The forceful airflow may cause air particles to travel through aperture 120 in the +Y direction and towards microphone 160. It should be appreciated that, although FIGS. 2A and 2B only show microphone 160, the performance of any one of microphones 161 and 162 may also be affected by forceful airflow.

Figure 3:
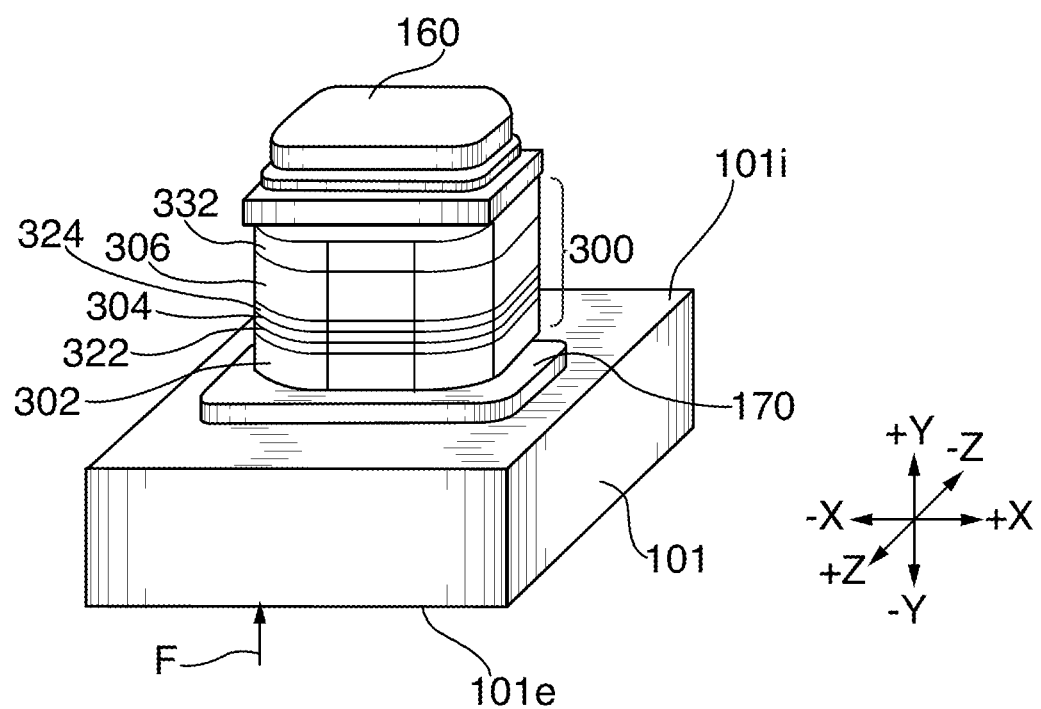
FIG. 3 shows the portion of the electronic device of FIG. 2A including an airflow control system, in accordance with at least one embodiment.

FIG. 3 shows the portion of electronic device 100 of FIG. 2A including an airflow control system 300. Airflow control system 300 may, for example, be included in electronic device 100 to enhance the performance of microphone 160. For example, airflow control system 300 may prevent deliberate and/or forceful airflow from interfering with the operation of microphone 160. As another example, airflow control system 300 may reduce undesired noise (e.g., from windy conditions in an outdoor environment) from being detected by microphone 160. Thus, airflow control system 300 may not be triggered to impede airflow that electronic device 100 may experience during normal usage thereof, but may instead be triggered to only impede airflow that may be caused during a high pressure or high airflow event. Airflow control system 300 may include a stack of components (e.g., a stack of die-cuts) that may include a bottom plate 302, an airflow impedance plate 304 sandwiched by two impedance adhesives 322 and 324, a top plate 306, and a top plate adhesive 332. Although not shown, each of bottom plate 302, airflow impedance plate 304, impedance adhesives 322 and 324, top plate 306, and top plate adhesive 332 may include one or more apertures or openings that may allow sound to pass (e.g., from bottom plate 302 all the way up through top plate adhesive 332).

Figure 4:
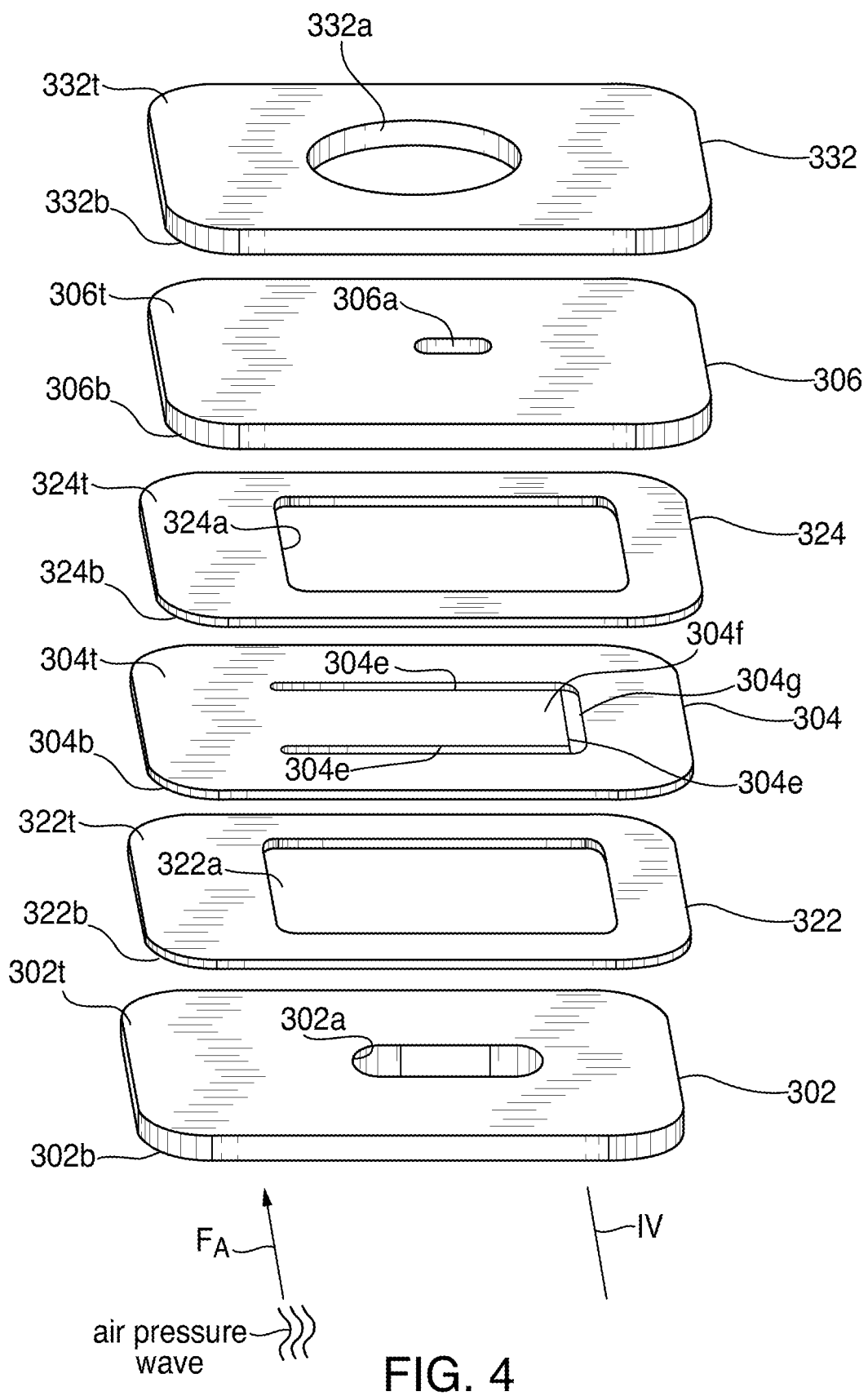
FIG. 4 shows an exploded view of the airflow control system of FIG. 3, in accordance with at least one embodiment.

FIG. 4 shows an exploded view of airflow control system 300. As shown in FIG. 4, bottom plate 302, airflow impedance plate 304, impedance adhesives 322 and 324, top plate 306, and top plate adhesive 332 may each include one or more apertures or openings, and may stack upon one another to form airflow control system 300. Bottom plate 302 may be substantially flat and may include a bottom plate aperture 302a having a particular size. In some embodiments, bottom plate aperture 302a may be chemically etched. In other embodiments, bottom plate aperture 302a may be laser-cut via a fine-focused laser. Bottom plate 302 may be composed of any suitable material (e.g., 0.22MM PET, 0.20MM SUS 301, acrylic, stainless steel, etc.).

Bottom plate 302 may include a top surface 302t and a bottom surface 302b. Bottom surface 302b may rest on internal surface side 101i of housing 101 such that bottom plate aperture 302a may at least partially align with housing aperture 120 (e.g., to allow sound to pass in the +Y direction of FIG. 3). Bottom plate aperture 302a may be smaller, similar in size, or larger than housing aperture 120. In some embodiments, bottom surface 302b may also be attached to internal surface side 101i via an adhesive (not shown). In other embodiments, internal surface side 101i of housing 101 may function as bottom plate 302 (e.g., without the need for bottom plate 302) and housing aperture 120 may function as bottom aperture 302a. Bottom plate 302 may also include one or more bumps (not shown) on any of top surface 302t and bottom surface 302b that may function as standoffs between bottom plate 302 and a corresponding adjacent component (e.g., internal surface side 101i, airflow impedance plate 304, an adhesive, etc.). In some embodiments, these bumps or standoffs may prevent one or more portions of airflow impedance plate 304 (e.g., bendable flap 304f) from adhering or otherwise sticking to top surface 302t of bottom plate 302 (e.g., due to moisture or static electricity).

Bottom surface 322b of impedance adhesive 322 may rest on top surface 302t of bottom plate 302. Top surface 322t of impedance adhesive 322 may contact bottom surface 304b of airflow impedance plate 304. Accordingly, impedance adhesive 322 may couple or attach bottom plate 302 to airflow impedance plate 304, and may also act as an acoustic seal between these plates. Impedance adhesive 322 may be substantially flat and may include impedance adhesive aperture 322a that may at least partially overlap with bottom plate aperture 302a to allow sound to pass therethrough. Impedance adhesive 322 may be composed of any suitable material (e.g., acrylic adhesive, such as NITTO 5605, etc.) and may have a similar size as bottom plate 302. Impedance adhesive aperture 322a may be larger than bottom plate aperture 302a (e.g., in order to expose certain portions of airflow impedance plate 304 to airflow that may pass upward through bottom plate aperture 302a).

Airflow impedance plate 304 may be composed of any suitable material (e.g., PET, silicon, or any other suitable material that may bend, flex, and/or have any suitable elastic property), and may have a similar size as bottom plate 302 and impedance adhesive 322. Airflow impedance plate 304 may have any suitable thickness (e.g., 30 um). Airflow impedance plate 304 may also be substantially flat, and may include a bendable flap 304f. The actual geometry and elastic properties (e.g., stiffness) of airflow impedance plate 304 may be defined such that bendable flap 304f may bend with respect to the rest of airflow impedance plate 304 in the presence of an air pressure wave (e.g., at force F described above). Bendable flap 304f may form a portion of airflow impedance plate 304, but may include edges 304e that may separate bendable flap 304f from the rest of airflow impedance plate 304. These separations may form gap 304g between edges 304e and adjacent portions of airflow impedance plate 304. In some embodiments, bendable flap 304f may be created by cutting out a U-shaped portion of airflow impedance plate 304.

Bendable flap 304f may, via impedance adhesive aperture 322a, be exposed to portions of top surface 302t of bottom plate 302. In such a configuration, airflow that passes through bottom plate aperture 302a and impedance adhesive aperture 322a may exert a minimum of force F, and this force may impinge on bottom surface 304b of bendable flap 304f and cause it to bend upward (e.g., in the +Y direction of FIG. 3).

Bottom surface 324b of impedance adhesive 324 may rest on top surface 304t of airflow impedance plate 304. Top surface 324t of impedance adhesive 324 may contact bottom surface 306b of top plate 306. Accordingly, impedance adhesive 324 may couple or attach airflow impedance plate 304 to top plate 306. Impedance adhesive 324 may be similar to impedance adhesive 322 and may include a similar impedance adhesive aperture 324a. In particular, impedance adhesive aperture 324a may be large enough for bendable flap 304f to at least partially cover or block top plate aperture 306a of top plate 306, when bendable flap 304f is subjected to at least force F. In this manner, airflow (or an air pressure wave) that may exert at least a predetermined amount of force, may be substantially inhibited from passing through top plate aperture 306a and up towards microphone aperture 160a.

Top plate 306 may be similar to bottom plate 302 (e.g., having a similar size and composed of similar materials). Top plate aperture 306a may be smaller than bottom plate aperture 302a, but may be similar in size to microphone aperture 160a. Top surface 306t of top plate 306 may attach or couple to circuit board 170 via top plate adhesive 332 (e.g., which may be similar to impedance adhesives 322 and 324). Top plate adhesive 332 may be composed of any suitable material (e.g., NITTO 5615) and may include a top plate aperture 332a.

It is known that microphones are typically designed or tuned to a specific frequency response, where sound within a certain range of frequencies is captured with minimal loss of amplitude. Accordingly, although it may be important to impede forceful airflow from affecting the performance of microphone 160, it may also be important to allow sound to successfully pass therethrough. In particular, it may be desirable to allow sound, which may match the frequency response of microphone 160, to successfully pass through the stack of components of airflow control system 300 and towards microphone aperture 160a.

Bendable flap 304f may be configured (e.g., by controlling its stiffness) to only slightly bend upward in the +Y direction of FIG. 3 when such sound travels into electronic device 100. That is, portions of this sound may cause bendable flap 304f to only bend slightly upward (or not bend upward at all), while other portions of this sound may pass through gap 304g and up through top plate aperture 306a and microphone aperture 160a. For example, bendable flap 304f may be configured based on a force that is typically exerted by airflow carrying sound at different amplitudes and at different frequencies in the human audible frequency range (e.g., 20 Hz to 20 kHz) or that matches the frequency response of microphone 160. As another example, bendable flap 304f may be configured based on a force exerted by deliberate forceful airflow or extreme environmental conditions such as wind. In this manner, airflow control system 300 may be constructed to both impede forceful airflow therethrough and match the frequency response of microphone 160.

It should also be appreciated that impedance adhesives 322 and 324 may, in addition to coupling bottom plate 302 to airflow impedance plate 304, and coupling airflow impedance plate 304 to top plate 306, respectively, may each also be configured to match the frequency response of microphone 160. For example, any of the thickness and texture of each of these adhesives may be configured such that a respective space is created in the stack of airflow control system 300. This space may control resonance within airflow control system 300 (e.g., by preventing inner surfaces of airflow control system 300 from vibrating at the same frequencies as sound that may travel therethrough).

Figure 5A:
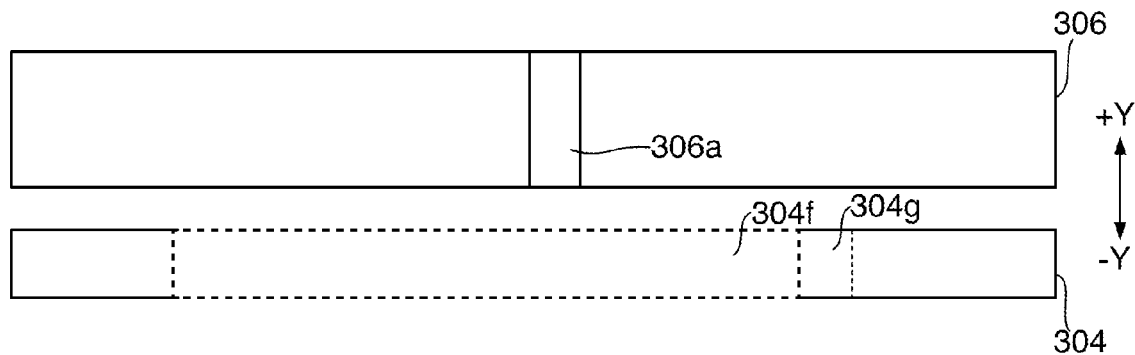
FIG. 5A is a side view of a portion of the airflow control system of FIG. 3 in a first state, in accordance with at least one embodiment.
Figure 5B:
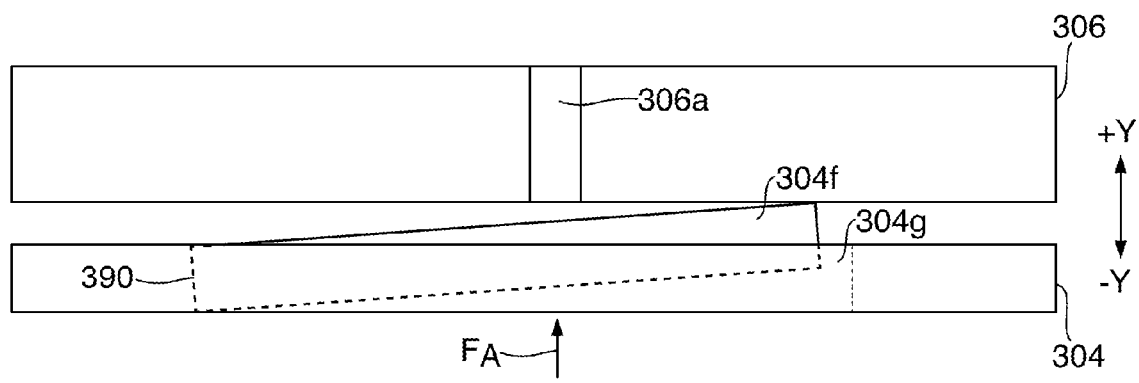
FIG. 5B is a side view of the portion of the airflow control system of FIG. 3 in a second state, in accordance with at least one embodiment.
Figure 5C:
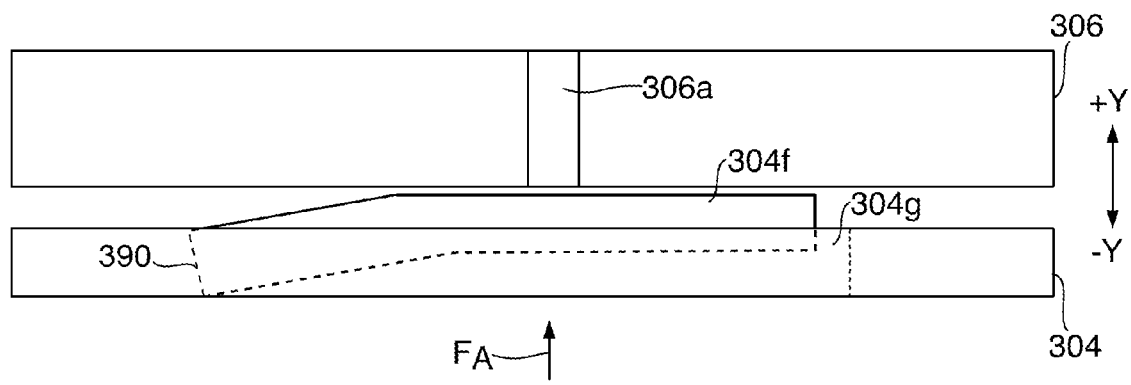
FIG. 5C is yet another side view of the portion of the airflow control system of FIG. 3 in an alternative second state, in accordance with at least one embodiment.

FIGS. 5A-5C are side views of top plate 306 and airflow impedance plate 304, taken from the −Z direction of FIG. 3. For the sake of simplicity, FIGS. 5A-5C only show top plate 306 and airflow impedance plate 304. However, it should be appreciated that the other components of airflow control system 300 (e.g., bottom plate 302, impedance adhesives 322 and 324, and top adhesive 332 may also be present as described above). As shown in FIG. 5A, airflow impedance plate 304 may reside beneath top plate 306. Bendable flap 304f may be in its natural position (e.g., substantially parallel with the rest of airflow impedance plate 304). Gap 304g may be present between a portion of bendable flap 304f and a corresponding portion of the rest of airflow impedance plate 304. Bendable flap 304f may rest in this natural position either when no airflow is traveling in the +Y direction or when airflow is traveling in the +Y direction, but that may exert a force onto the bottom surface of bendable flap 304f at less than force F described above (e.g., airflow due to sound).

FIG. 5B shows bendable flap 304f bending in the +Y direction with respect to the rest of airflow impedance plate 304. For example, bendable flap 304f may bend, as shown, when airflow traveling in the +Y direction exerts a force onto the bottom surface of bendable flap 304f equal to or greater than force F. As shown in FIG. 5B, when bendable flap 304f bends due to this airflow, a top portion of bendable flap 304f may at least partially cover or block top plate aperture 306a and prevent some or all of the airflow from traveling through top plate aperture 306a. In this manner, airflow that exerts at least a force F may be prevented from traveling toward microphone 160. For example, it may be known that performance of the diaphragm of microphone 160 may be affected when airflow (or an air pressure event) exerts a force of at least $F_A$ onto the diaphragm. By integrating airflow control system 300 between microphone 160 and housing aperture 120, and configuring at least bendable flap 304f to bend and at least partially cover top plate aperture 306a, the performance of microphone 160 may be enhanced.

As shown in FIG. 5B, bendable flap 304f may be configured to only bend at a portion 390 that may form a portion of airflow impedance plate 304, where the rest of bendable flap 304f may remain substantially straight. In some embodiments, bendable flap 304f may be configured to bend throughout, as shown in FIG. 5C. For example, when airflow exerts at least force F onto the bottom surface of bendable flap 304f, bendable flap 304f may bend throughout such that the top portion of bendable flap 304f may substantially or fully cover top plate aperture 306a. In these embodiments, airflow control system 300 may be configured to more effectively impede the airflow from affecting the performance of microphone 160. In fact, bendable flap 304f may be configured such that a stronger force F may result in airflow that exerts a larger force (e.g., larger than force F) onto the bottom surface of bendable flap 304f. In this configuration, the top surface of bendable flap 304f may more closely (or more effectively) shield or seal top plate aperture 306a, and may thus substantially attenuate an air pressure wave that may otherwise affect the performance of microphone 160.

Figure 6:
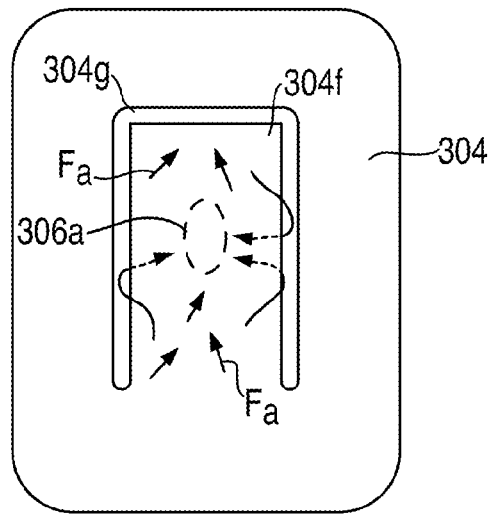
FIG. 6 is a bottom view of an airflow impedance plate of the airflow control system of FIG. 3, in accordance with at least one embodiment.

FIG. 6 shows airflow impedance plate 304 and top plate aperture 306a, taken from either a line IV of FIG. 4 or the +Y direction of FIG. 3. As shown in FIG. 6, air particles from airflow may exert forces $F_a$ onto portions of bottom surface 304b of bendable flap 304f. Other air particles from the airflow may find their way toward top plate aperture 306a via gap 304g. When the airflow is a result of sound, the airflow may exert a force less than force F onto the bottom surface of bendable flap 304f. This aggregate force may cause bendable flap 304f to bend slightly (or may not cause bendable flap 304 to bend at all). Remaining portions of the airflow may travel around bendable flap 304f via gap 304g and continue through top plate aperture 306a. In this manner, sound (e.g., that may match the frequency response of microphone 160) may pass through airflow control system 300 with little to no inhibition.

In contrast, when the airflow is a result of deliberate forceful airflow, for example, air particles from the airflow may exert an aggregate force (e.g., of forces $F_a$) equal to or greater than force F onto the bottom surface of bendable flap 304f. This aggregate force may cause bendable flap 304f to bend (e.g., as shown in FIG. 5B or 5C), and remaining portions of the airflow may also travel around bendable flap 304f via gap 304g and continue past bendable flap 304f. However, because bendable flap 304f may at least partially (or substantially) cover or block top plate aperture 306a (e.g., as shown in FIGS. 5B and 5C), the airflow may be substantially inhibited from passing through top plate aperture 306a and microphone aperture 160a.

Figure 7:
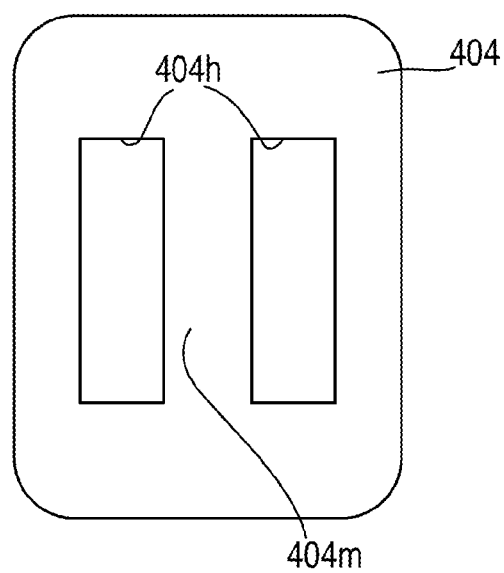
FIG. 7 is a top view of an alternative airflow impedance plate for the airflow control system of FIG. 3, in accordance with at least one embodiment.

FIG. 7 is a plan view of an alternative airflow impedance plate 404 that may be similar to airflow impedance plate 304. Airflow impedance plate 404 may be composed of a similar material as airflow impedance plate 304, and may have any suitable thickness (e.g., 0.03 mm). Instead of a bendable flap, however, airflow impedance plate 404 may include two holes 404h and a middle portion 404m. Each of middle portion 404m and holes 404h may have any suitable size (e.g., each hole 404 may be 0.05 mm wide) for impeding and passing airflow therethrough, respectively. Similar to airflow impedance plate 304, airflow impedance plate 404 may be configured to both control airflow towards microphone aperture 160a, as well as pass sound that matches a frequency response of microphone 160. When airflow impedance plate 404 is aligned with top plate 306 (e.g., similar to how airflow impedance plate 304 is aligned with top plate 306, as shown in FIGS. 3 and 4), middle portion 404m may substantially block or impede airflow (e.g., that may be traveling in the +Y direction of FIG. 3) from directly flowing toward top plate aperture 306a. Simultaneously, holes 404h may allow sound (e.g., that may be traveling in the +Y direction of FIG. 3) to pass through toward top plate aperture 306a with minimal to no inhibition.

Figure 8:
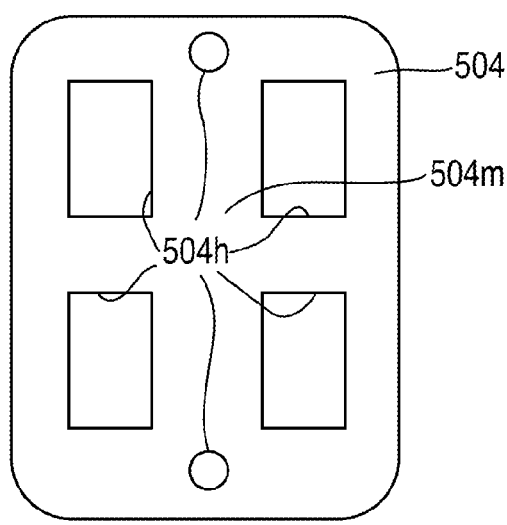
FIG. 8 is a top view of another alternative airflow impedance plate for the airflow control system of FIG. 3, in accordance with at least one embodiment.

FIG. 8 is a plan view of yet another alternative airflow impedance plate 504 that may be similar to airflow impedance plate 404. Instead of just two holes, however, airflow impedance plate 504 may include a plurality of holes 504*h* and a middle portion 504*m*. Each of middle portion 504*m* and each of holes 504*h* may have any suitable size for impeding and passing airflow therethrough, respectively. That is, similar to airflow impedance plate 404, airflow impedance plate 504 may be configured to both control airflow towards microphone aperture 160*a*, as well as pass sound that matches a frequency response of microphone 160. For example, when airflow impedance plate 504 is aligned with top plate 306 (e.g., similar to how airflow impedance plate 304 is aligned with top plate 306, as shown in FIGS. 3 and 4), middle portion 504*m* may substantially block or impede airflow (e.g., that may be traveling in the +Y direction of FIG. 3) from directly flowing toward top plate aperture 306*a*. Simultaneously, holes 504*h* may allow sound (e.g., that may be traveling in the +Y direction of FIG. 3) to pass therethrough and toward top plate aperture 306*a* with minimal to no inhibition.

Figure 9:
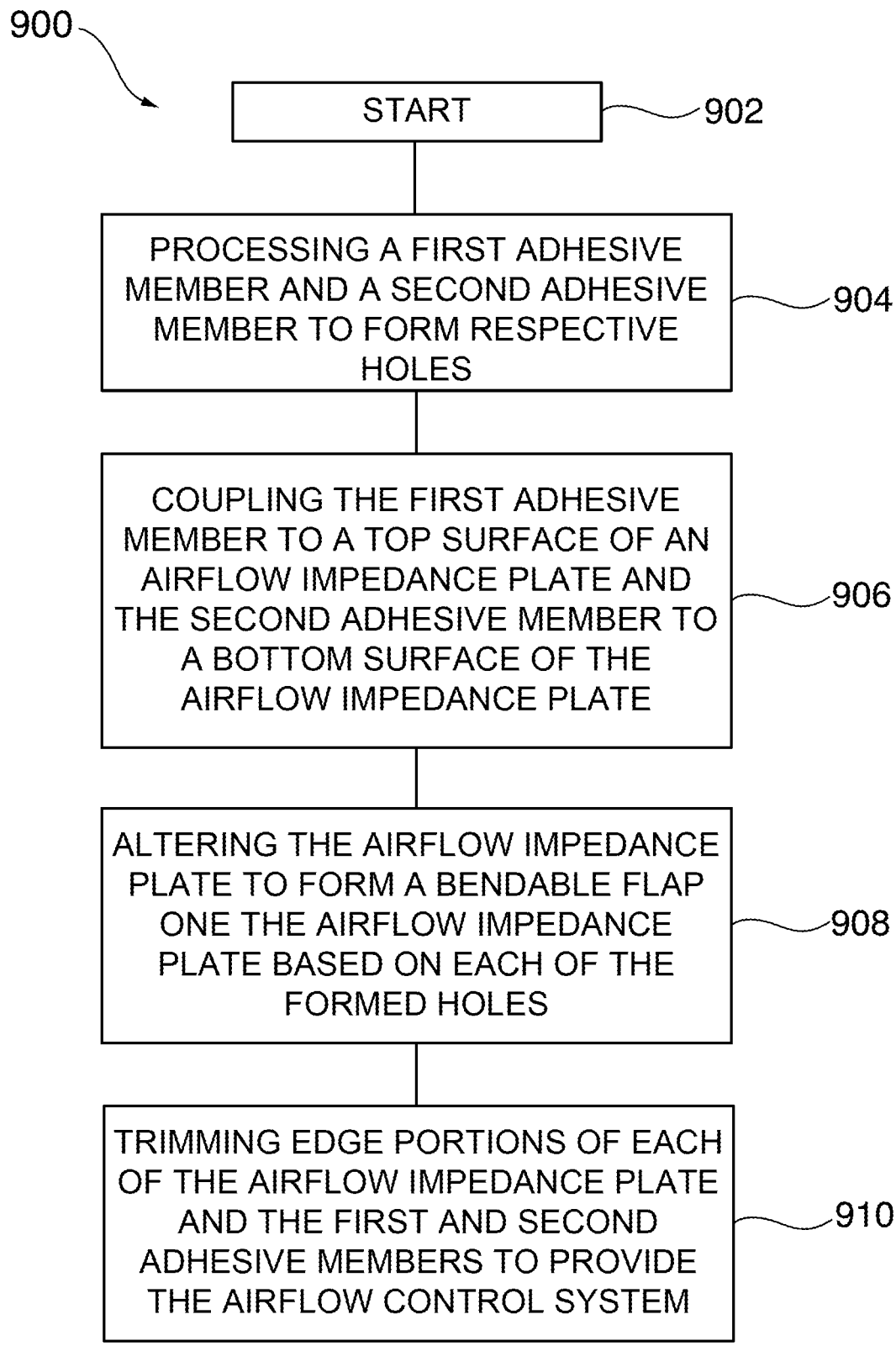
FIG. 9 is an illustrative process of manufacturing the airflow control system of FIG. 3, in accordance with at least one embodiment.

FIG. 9 is an illustrative process of manufacturing airflow control system 300 of FIG. 3. The process may begin at step 902. At step 904, the process may include processing a first adhesive member and a second adhesive member to form respective holes. For example, the process may include processing impedance adhesive 322 and impedance adhesive 324 to form respective impedance adhesive apertures 322*a* and 324*a*. In some embodiments, the first adhesive member and the second adhesive member may be formed from a single sheet of adhesive.

At step 906, the process may include coupling the first adhesive member to a top surface of an airflow impedance plate and the second adhesive member to a bottom surface of the airflow impedance plate. For example, the process may include coupling impedance adhesive 324 to top surface 304*t* of airflow impedance plate 304 and impedance adhesive 322 to bottom surface 304*b* of airflow impedance plate 304. At this step, airflow impedance plate 304 may not yet include the bendable flap 304*f* and gap 304*g* features. That is, airflow impedance plate 304 may not yet be processed to form bendable flap 304 and gap 304*g*.

At step 908, the process may include altering the airflow impedance plate to form a bendable flap on the airflow impedance plate based on each of the formed holes. For example, after airflow impedance plate 304 is laminated or coupled to impedance adhesives 322 and 324, the process may include altering airflow impedance plate 304 to form bendable flap 304*f* on airflow impedance plate 304 based on impedance adhesive apertures 322*a* and 324*a*. In some embodiments, the process may include chemically etching a U-shape into airflow impedance plate 304. In other embodiments, the process may include laser cutting the U-shape into airflow impedance plate 304. The altering step may also include removing a U-shaped portion of airflow impedance plate 304 based on the cut U-shape to form gap 304*g*.

At step 910, the process may include trimming edge portions of each of the airflow impedance plate and the first and second adhesive members to provide an airflow control system. For example, the process may include trimming edge portions of each of airflow impedance plate 304 and impedance adhesives 322 and 324 to provide airflow control system 300. In some embodiments, the process may include trimming airflow impedance plate 304 and impedance adhesives 322 and 324 to a particular size and/or shape via die-cutting.

In some embodiments, the process may also include coupling the first and second adhesive members to respective top and bottom plates. For example, the process may also include coupling impedance adhesive 322 to bottom plate 302 and impedance adhesive 324 to top plate 306. As a result, a complete stack of components may provide the airflow control function of airflow control system 300 described above.

It is to be understood that the steps shown in process 900 of FIG. 9 are merely illustrative and that existing steps may be modified or omitted, additional steps may be added, and the order of certain steps may be altered.

Figure 10:
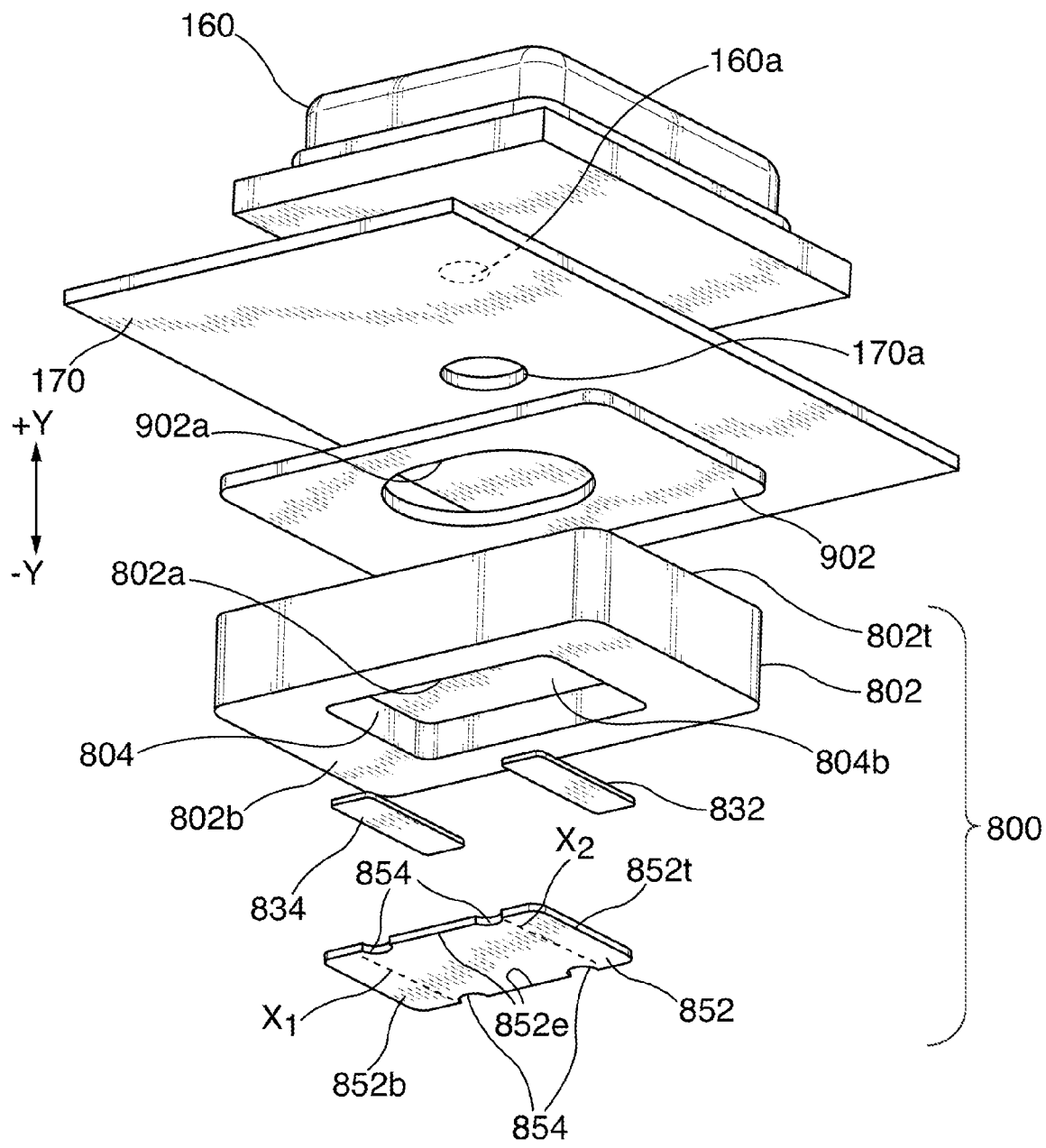
FIG. 10 is an exploded view of the microphone of FIG. 2A and an alternative airflow control system, in accordance with at least one embodiment.
Figure 14:
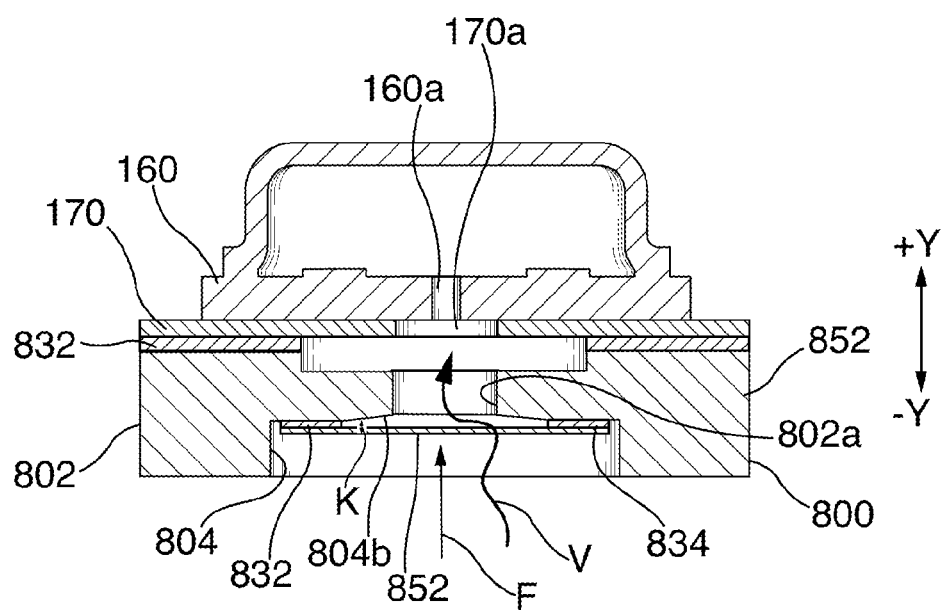
FIG. 14 is a partial cross-sectional view of the microphone and alternative airflow control system of FIG. 10, taken from a line B-B of FIG. 12, in accordance with at least one embodiment.

As described above with respect to FIGS. 2A and 2B, microphone 160 may include a diaphragm (not shown) that may receive sound, and may process the received sound and/or send the received sound to processor 102 for processing. The performance of one or more components of microphone 160 (e.g., the diaphragm) may be affected, for example, when airflow is forcefully directed at microphone 160, at or above a predefined force F. The forceful airflow may cause air particles to travel through in the +Y direction of FIGS. 2A and 2B, and towards microphone 160. FIG. 10 is an exploded view of microphone 160 and an alternative airflow control system 800. Similar to airflow control system 300, alternative airflow control system 800 may be configured to prevent deliberate and/or forceful airflow from interfering with the operation of microphone 160. Moreover, alternative airflow control system 800 may also reduce undesired noise (e.g., from windy conditions in an outdoor environment) from being detected by microphone 160. As shown in FIG. 10, alternative airflow control system 800 may include a block-shaped structure 802, adhesives 832 and 834, and airflow impedance sheet 852. Block-shaped structure 802 may be composed of any suitable material (e.g., metal, plastic, etc.) and may include a top surface 802*t* and a bottom surface 802*b*. Block-shaped structure 802 may also include a recess 804, a recess surface 804*b*, and an aperture 802*a* through recess surface 804*b*. Aperture 802*a* may extend from recess surface 804*b* to top surface 802*t*. Adhesive 832 may be similar to adhesive 834, and may be composed of any suitable material. Adhesives 832 and 834 may couple to corresponding portions of recess surface 804*b*, and may also couple to corresponding portions of top surface 852*t* of airflow impedance sheet 852. As shown in FIG. 14, for example, portions of recess surface 804*b* may be curved or dished such that it may more easily conform with airflow impedance sheet 852.

Airflow impedance sheet 852 may be substantially flat and may be composed of any suitable material (e.g., PET film). Airflow impedance sheet 852 may include top surface 852*t*, a bottom surface 852*b*, and edges 852*e*. As shown in FIG. 10, microphone 160 may couple to circuit board 170 such that microphone aperture 160*a* and circuit board aperture 170*a* may align. Further, top surface 802*t* of block-shaped structure 802 may couple to circuit board 170 via an adhesive 902. Adhesive 902 may be similar to each one of adhesives 832 and 834, and may include an aperture 902*a*. Each one of microphone 160, circuit board 170, adhesive 902, block-shaped structure 802, adhesives 832 and 834, and airflow impedance sheet 852 may align with one another to fluidically couple aperture 802*a* with microphone aperture 160*a*.

Figure 11:
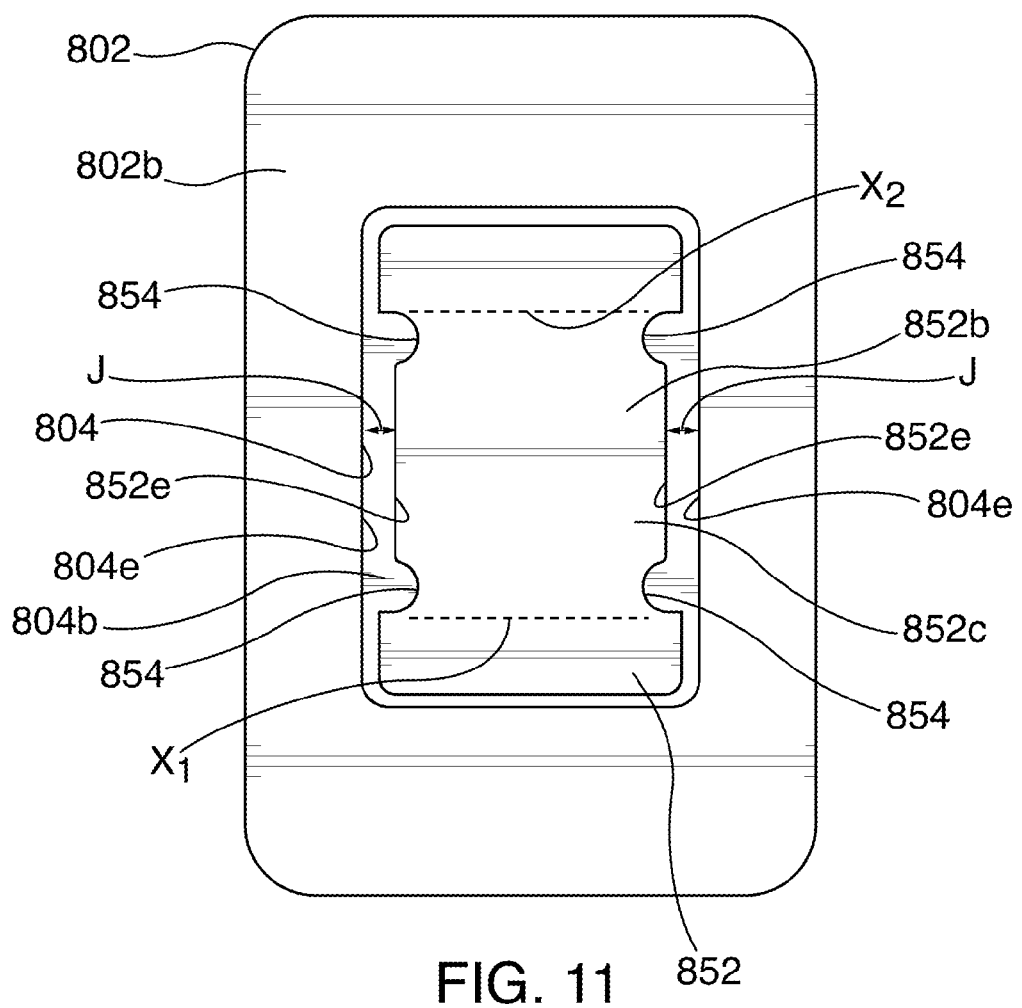
FIG. 11 is a view of a bottom surface of a block-shaped structure of the alternative airflow control system of FIG. 10, taken in a +Y direction of FIG. 10, in accordance with at least one embodiment.

FIG. 11 is a view of bottom surface 802*b* of block-shaped structure 802, taken in a +Y direction of FIG. 10. As shown in FIG. 11, airflow impedance sheet 852 may be coupled (e.g., via adhesives 832 and 834) to recess surface 804*b* of block-shaped structure 802. In some embodiments, the actual geometry and elastic properties (e.g., stiffness) of airflow impedance sheet 852 may be defined such that at least a portion of airflow impedance sheet 852 may bend in the presence of an air pressure wave (e.g., force F described above). Airflow impedance sheet 852 may also include a plurality of relief cuts 854 that may allow a portion of airflow impedance sheet 852 (e.g., a portion that may extend from a line $X_1$ to a line $X_2$) to bend with respect to remaining portions of airflow impedance sheet 852. In particular, airflow impedance sheet 852 may be configured such that center portion 852c of airflow impedance sheet 852 may bend or move when forceful airflow (e.g., at or above force F described above) is applied to bottom surface 852b of portion 852c. If edges 852e are flush or are allowed to contact sides 804e of recess 804, then edges 852e and/or recess 804 of block-shaped structure 802 may, for example, become damaged over time. For example, edges 852e may contact or catch onto edges 804e, which may prevent edges 852e from moving in the ±Y directions. To prevent this from occurring, airflow impedance sheet 852 may have an area that is smaller than an area of recess 804. In particular, edges 852e of airflow impedance sheet 852 may be offset from sides 804e of recess 804 (e.g., by a distance of J). In this manner, rubbing and/or contacting of airflow impedance sheet 852 with sides 804e of recess 804 may be prevented.

Although not shown in FIG. 11, adhesives 832 and 834 may separate airflow impedance sheet 852 from recess surface 804b by a predefined distance (e.g., by a distance that may be equal to a thickness of adhesives 832 and 834). Thus, top surface 852b of portion 852c of airflow impedance sheet 852 may be separated from aperture 802a of block-shaped structure 802 by this predefined distance. In this manner, when forceful airflow impinges onto bottom surface 852b of airflow impedance sheet 852, portion 852c of airflow impedance sheet 852 may bend and/or move towards aperture 802a to at least partially block or cover aperture 802a. This may prevent the forceful airflow from traveling into and affecting the performance of microphone 160.

As described above with respect to FIGS. 2A and 2B, it is known that microphones are typically designed or tuned to a specific frequency response, where sound within a certain range of frequencies is captured with minimal loss of amplitude. Accordingly, although it may be important to impede forceful airflow from affecting the performance of microphone 160, it may also be important to allow sound to successfully pass therethrough. In particular, it may be desirable to allow sound, which may match the frequency response of microphone 160, to successfully pass through alternative airflow control system 800 and towards microphone aperture 160a. Thus, in some embodiments, airflow impedance sheet 852 may be configured (e.g., by controlling its stiffness) to only slightly bend upward in the +Y direction of FIG. 10 when such sound travels into electronic device 100. That is, portions of this sound may cause portion 852c of airflow impedance sheet 852 to only bend slightly upward (or not bend upward at all), while other portions of this sound may pass through a gap that may exist between recess surface 804b and top surface 852t of portion 852c.

Figure 12:
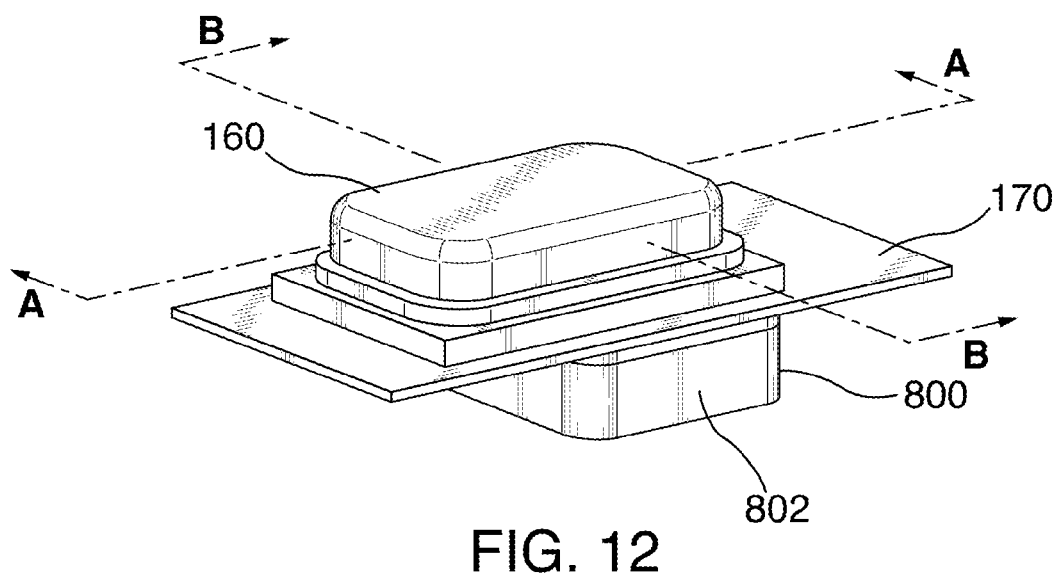
FIG. 12 is a perspective view of the microphone and alternative airflow control system of FIG. 10, in accordance with at least one embodiment.
Figure 13:
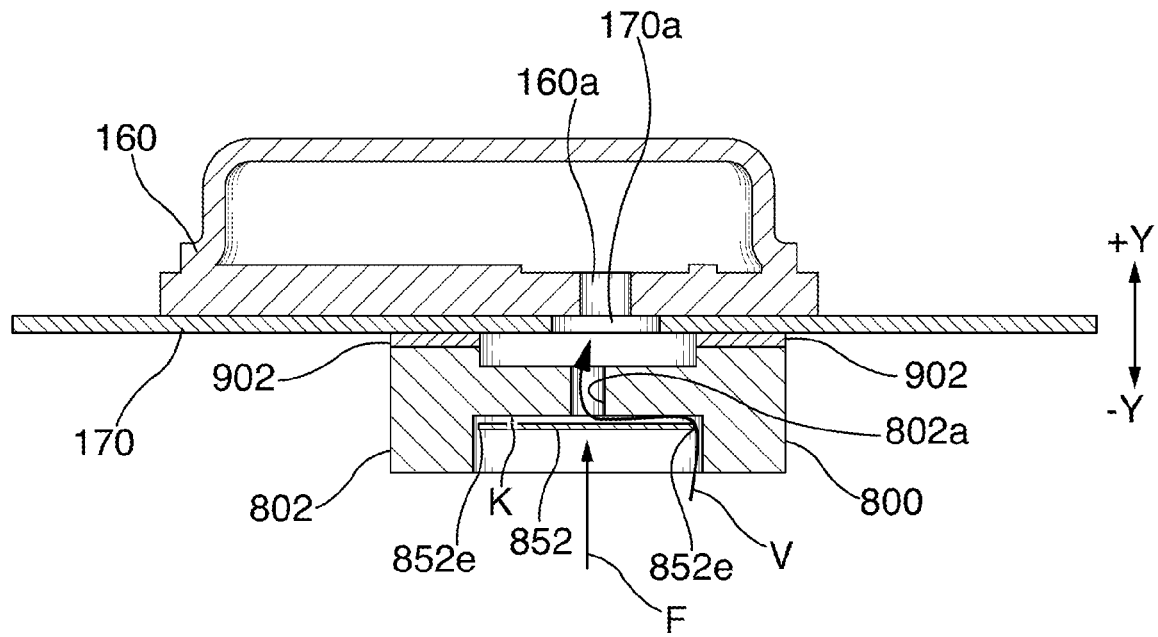
FIG. 13 is a partial cross-sectional view of the microphone and alternative airflow control system of FIG. 10, taken from a line A-A of FIG. 12, in accordance with at least one embodiment.

FIG. 12 is a perspective view of microphone 160 integrated with alternative airflow control system 800. FIG. 13 is a partial cross-sectional view of microphone 160 and alternative airflow control system 800, taken from a line A-A of FIG. 10. FIG. 14 is a partial cross-sectional view of microphone 160 and alternative airflow control system 800, taken from a line B-B of FIG. 10. As shown in FIGS. 13 and 14, a gap k may exist between recess surface 804b and top surface 852t of portion 852c. When sound travels in the +Y direction towards microphone 160 (e.g., at a force that may be less than force F), portion 852c may only bend slightly upward (or not bend upward at all). In this manner, the sound may travel around edges 852e and up through aperture 802a and microphone aperture 160a. In contrast, when forceful airflow travels in the +Y direction towards microphone 160 (e.g., at or above force F), portion 852c may bend upward to at least partially block and/or cover aperture 802a of block-shaped structure 802. When aperture 802a is blocked or covered in this manner, most or all of the air particles of the forceful airflow may be prevented from traveling through aperture 802a and towards microphone 160.

Similar to airflow control system 300, in some embodiments, airflow impedance sheet 852 may be configured based on a force that is typically exerted by airflow carrying sound at different amplitudes and at different frequencies in the human audible frequency range (e.g., 20 Hz to 20 kHz) or that matches the frequency response of microphone 160. As another example, airflow impedance sheet 852 may be configured based on a force exerted by deliberate forceful airflow or extreme environmental conditions such as wind. In this manner, alternative airflow control system 800 may be constructed to both impede forceful airflow therethrough and match the frequency response of microphone 160.

It should also be appreciated that adhesives 832 and 834 may, in addition to coupling airflow impedance sheet 852 to block-shaped structure 802, may also be configured to match the frequency response of microphone 160. For example, any of the thickness and texture of each adhesives 832 and 834 may be configured to create gap k. Gap k may control resonance within alternative airflow control system 800 (e.g., by preventing inner surfaces of alternative airflow control system 800 from vibrating at the same frequencies as sound that may travel therethrough).

While there have been described systems and methods for controlling airflow into an electronic device, it is to be understood that many changes may be made therein without departing from the spirit and scope of the invention. Insubstantial changes from the claimed subject matter as viewed by a person with ordinary skill in the art, now known or later devised, are expressly contemplated as being equivalently within the scope of the claims. Therefore, obvious substitutions now or later known to one with ordinary skill in the art are defined to be within the scope of the defined elements. It is also to be understood that various directional and orientational terms such as "up and "down," "front" and "back," "top" and "bottom," "left" and "right," "length" and "width," and the like are used herein only for convenience, and that no fixed or absolute directional or orientational limitations are intended by the use of these words. For example, the devices of this invention can have any desired orientation. If reoriented, different directional or orientational terms may need to be used in their description, but that will not alter their fundamental nature as within the scope and spirit of this invention. Moreover, an electronic device constructed in accordance with the principles of the invention may be of any suitable three-dimensional shape, including, but not limited to, a sphere, cone, octahedron, or combination thereof.

Therefore, those skilled in the art will appreciate that the invention can be practiced by other than the described embodiments, which are presented for purposes of illustration rather than of limitation.

What is claimed is:

1. An airflow control system for controlling airflow to a microphone, the airflow control system comprising:
   a top plate having a top plate aperture; and
   an airflow impedance plate disposed below the top plate, the airflow impedance plate comprising a flat surface and a bendable flap partially separated from the flat surface and comprising a top face and a bottom face, the bendable flap operative to bend with respect to the flat surface and at least partially cover the top plate aperture with the top face when a force exerted by the airflow onto the bottom face exceeds a predetermined amount, wherein the bendable flap is further configured to remain substantially parallel with the flat surface to allow sound to pass through the top plate aperture.

2. The airflow control system of claim 1, wherein the bendable flap is further operative to remain substantially parallel with the flat surface when the force exerted by the airflow is less than the predetermined amount.

3. The airflow control system of claim 1, wherein:
the airflow comprises a frequency response of the microphone; and
the bendable flap is further configured to remain substantially parallel with the flat surface to allow the airflow to pass through the top plate aperture.

4. The airflow control system of claim 1, wherein the bendable flap forms a portion of the flat surface.

5. The airflow control system of claim 1, wherein the bendable flap comprises at least one edge that is separated from the flat surface.

6. The airflow control system of claim 1 further comprising a bottom plate disposed below the airflow impedance plate, the bottom plate having a bottom plate aperture.

7. The airflow control system of claim 6, wherein the bottom plate aperture is larger than the top plate aperture.

8. A method of manufacturing an airflow control system, the method comprising:
processing a first adhesive member and a second adhesive member to form respective holes;
coupling the first adhesive member to a top surface of an airflow impedance plate and the second adhesive member to a bottom surface of the airflow impedance plate;
altering the airflow impedance plate to form a bendable flap on the airflow impedance plate based on each of the formed holes, wherein the bendable flap is operative to bend with respect to a flat surface of the airflow impedance plate and at least partially cover an aperture when a force exerted by an airflow onto a face of the airflow impedance plate exceeds a predetermined amount, and the bendable flap is further configured to remain substantially parallel with the flat surface to allow sound to pass through the aperture; and
trimming edge portions of each of the airflow impedance plate and the first and second adhesive members to provide the airflow control system.

9. The method of claim 8, wherein the processing comprises one of chemically etching and laser cutting the first and second adhesive members to form the respective holes.

10. The method of claim 8, wherein the altering comprises cutting a U-shape into the airflow impedance plate.

11. The method of claim 8, wherein the cutting comprises removing a U-shaped portion of the airflow impedance plate to form at least one gap between the bendable flap and the rest of the airflow impedance plate.

12. The method of claim 8 further comprising coupling the first and second adhesive members to respective top and bottom plates.

13. An electronic device comprising:
a housing comprising a housing aperture;
a microphone having a microphone aperture; and
an airflow control system secured between the housing aperture and the microphone aperture, the airflow control system fluidically coupling the housing aperture to the microphone aperture and comprises a top plate having a top plate aperture and an airflow impedance plate, the airflow impedance plate comprising a flat surface and a bendable flap partially separated from the flat surface and comprising a to face and a bottom face, the bendable flap operative to bend with respect to the flat surface and at least partially cover the top plate aperture with the top face when a force exerted by the airflow onto the bottom face exceeds a predetermined amount, wherein the bendable flap is further configured to remain substantially parallel with the flat surface to allow sound to pass through the top plate aperture.

14. The electronic device of claim 13, wherein the airflow control system further comprises a bottom plate that together with the top plate sandwiches the airflow impedance plate.

15. The electronic device of claim 14, wherein the bottom plate comprises a bottom plate aperture that is larger than the top plate aperture.

16. The electronic device of claim 14 further comprising a plurality of adhesives disposed the top plate, the bottom plate, and the airflow impedance plate.

17. The electronic device of claim 16, wherein the plurality of adhesives is tuned to match a frequency response of the microphone.

18. An airflow control system for controlling airflow to a microphone, the airflow control system comprising:
a block-shaped structure comprising a recess and a first aperture; and
an airflow impedance sheet disposed on the recess, the airflow impedance sheet comprising a surface having a top face and a bottom face, at least a portion of the surface being operative to bend and at least partially cover the first aperture with the top face when a force exerted by the airflow onto the bottom face exceeds a predetermined amount, wherein the portion of the surface is further configured to remain substantially parallel with a flat surface to allow sound to pass through the first aperture.

19. The airflow control system of claim 18, wherein the surface is further operative to remain substantially flat when the force exerted by the airflow is less than the predetermined amount.

20. The airflow control system of claim 18, wherein:
the airflow comprises sound that matches a frequency response of the microphone; and
the surface is further configured to remain substantially flat to allow the sound to pass through the first aperture.

21. An airflow control system for controlling airflow to a microphone, the airflow control system comprising:
a top plate having a top plate aperture;
an airflow impedance plate disposed below the top plate, the airflow impedance plate comprising a flat surface and a bendable flap partially separated from the flat surface and comprising a top face and a bottom face, the bendable flap operative to bend with respect to the flat surface and at least partially cover the top plate aperture with the top face when a force exerted by the airflow onto the bottom face exceeds a predetermined amount; and
an adhesive disposed between the airflow impedance plate and the top plate, wherein the adhesive is operative to create a spacing between the airflow impedance plate and the top plate that matches a frequency response of the microphone.

22. An airflow control system for controlling airflow to a microphone, the airflow control system comprising:
a block-shaped structure comprising a recess and a first aperture; and
an airflow impedance sheet disposed on the recess, the airflow impedance sheet comprising a surface having a top face and a bottom face, at least a portion of the surface being operative to bend and at least partially cover the first aperture with the top face when a force exerted by the airflow onto the bottom face exceeds a predetermined amount, wherein the airflow impedance sheet comprises a plurality of relief cuts on edges of the surface.

\* \* \* \* \*

UNITED STATES PATENT AND TRADEMARK OFFICE
CERTIFICATE OF CORRECTION

PATENT NO. : 8,953,833 B2  
APPLICATION NO. : 13/607512  
DATED : February 10, 2015  
INVENTOR(S) : Sawyer Cohen et al.

It is certified that error appears in the above-identified patent and that said Letters Patent is hereby corrected as shown below:

In the Claims

In column 17, at line 62, claim 13, delete "to" and insert --top--.

Signed and Sealed this  
Nineteenth Day of May, 2015

Michelle K. Lee  
*Director of the United States Patent and Trademark Office*